United States Patent

Kruk et al.

(10) Patent No.: US 7,308,323 B2
(45) Date of Patent: Dec. 11, 2007

(54) CONFIGURATION OUTPUT SYSTEM

(75) Inventors: James L. Kruk, Huntley, IL (US); R. Scott Lambert, Buffalo Grove, IL (US); Brian P. Gillespie, Byron Center, MI (US); Toby Lange, Crystal Lake, IL (US); Latasha Gardner, Richton Park, IL (US)

(73) Assignee: Siemens Building Technologies, Inc., Buffalo grove, IL (US)

( * ) Notice: Subject to any disclaimer, the term of this patent is extended or adjusted under 35 U.S.C. 154(b) by 414 days.

(21) Appl. No.: 11/051,712

(22) Filed: Feb. 4, 2005

(65) Prior Publication Data

US 2006/0058922 A1    Mar. 16, 2006

Related U.S. Application Data

(60) Provisional application No. 60/608,968, filed on Sep. 10, 2004.

(51) Int. Cl.
*G06F 17/50* (2006.01)
*G06F 17/00* (2006.01)
*G06F 9/44* (2006.01)
*G05B 15/00* (2006.01)
*G05B 13/02* (2006.01)

(52) U.S. Cl. .................. 700/32; 700/83; 700/275; 703/1; 705/400; 717/108

(58) Field of Classification Search .................. 700/32, 700/83; 705/10, 400; 703/1
See application file for complete search history.

(56) References Cited

U.S. PATENT DOCUMENTS

| 4,885,694 | A | * | 12/1989 | Pray et al. ..................... 705/40 |
|---|---|---|---|---|
| 6,028,998 | A | * | 2/2000 | Gloudeman et al. ........ 717/108 |
| 6,131,077 | A |  | 10/2000 | Normann et al. |
| 6,192,282 | B1 |  | 2/2001 | Smith et al. |
| 6,233,414 | B1 |  | 5/2001 | Farrell |
| 6,330,005 | B1 |  | 12/2001 | Tonelli et al. |
| 6,477,518 | B1 |  | 11/2002 | Li et al. |
| 6,748,343 | B2 |  | 6/2004 | Alexander et al. |

(Continued)

FOREIGN PATENT DOCUMENTS

WO    WO 2005/033912    4/2005

OTHER PUBLICATIONS

Property and Buildings Department, Asset Data unit, CAD Standards, Mar. 2001, The University of Melbourne.

(Continued)

*Primary Examiner*—Anthony Knight
*Assistant Examiner*—Sunray Chang

(57) ABSTRACT

A configuration output system for use with a building automation system is provided. The configuration output system includes a database and an output engine block. The database contains a configuration data set selected by a user. The output engine block is operable to generate a plurality of types of outputs representing the configured building automation system as a function of the configuration data set.

4 Claims, 16 Drawing Sheets

U.S. PATENT DOCUMENTS

| | | | |
|---|---|---|---|
| 6,859,768 B1 * | 2/2005 | Wakelam et al. | 703/1 |
| 7,016,813 B2 | 3/2006 | Alexander et al. | |
| 2003/0208341 A9 * | 11/2003 | Simmons et al. | 703/1 |
| 2004/0085362 A1 | 5/2004 | Sauermann et al. | |
| 2006/0055704 A1 | 3/2006 | Kruk et al. | |
| 2006/0058900 A1 * | 3/2006 | Johanson et al. | 700/83 |
| 2006/0058923 A1 * | 3/2006 | Kruk et al. | 700/275 |

OTHER PUBLICATIONS

Building Design and Engineering Services, HVAC Designer 02-05, CAE-Link Corporation, May 2003.

Definition from Widipedia for "Check box", "Widget" and "Radio button" (www.wikipedia.com).

* cited by examiner

FIG. 11A

CONFIGURATION OUTPUT SYSTEM

PRIORITY AND CROSS-REFERENCE TO RELATED APPLICATIONS

This application claims the benefit of the filing date under 35 U.S.C. §119(e) of Provisional U.S. Patent Application Ser. No. 60/608,968, filed on Sep. 10, 2004, entitled Method for Configuring a Building automation system, which is hereby incorporated in its entirety. The application is also related to U.S. patent applications filed on Feb. 4, 2005, entitled Building Control Configurator and User Interface for a Building Control System Configurator, and having attorney reference numbers 2004 P10921 US 01 and 2005 P01571 US, each of which is incorporated herein in its entirety by this reference.

BACKGROUND

1. Technical Field

The invention relates to a configuration output system for use with a building automation system. In particular, the invention relates to a configuration output system for generating a plurality of types of outputs for a configured building automation system.

2. Background Information

Building automation systems automate control of building systems and networks such as security, fire, hazard prevention, heating, ventilation, air conditioning (HVAC) or other control systems for buildings. For example, a building automation system includes controllers, sensors, actuators, chillers, fans, humidifiers, and/or air handling units that are positioned in the building and configured to provide a desired environment for the building or portion thereof. The components may be deployed individually or as groups. For example, a temperature sensor or thermostat positioned in a room provides a temperature reading or signal to a controller, and the controller generates a control signal for an actuator located in the room to effect changes in heating and/or cooling of the room.

Current building automation systems are manually designed, engineered and/or configured. A component or groups of components are individually and manually identified according to a specification or perceived needs for a building or particular areas of the building. Once a component or groups of components is identified, other components that may be necessary for the proper operation of the identified components within the system must also be manually and individually identified. For example, a building having a humidifier will also require a humidity sensor to provide feedback control for the humidifier. Once a building automation system is designed and its components identified, system plans may be developed, a list of components created, and an estimate calculated. However, manual configuration is labor-intensive, time-consuming and prone to errors. Estimates also may be inaccurate which may result in a delay in the fulfillment of the system.

The manual configuration further provides complications with preparation of the configured system plans. Based on discussions with customers and building specifications, designers prepare pre-rendered drawings that show a suitable building automation system plan for approval or review by other designers and/or customers. Designers also prepare documents that explain or summarize the configured system plans and estimated cost. These drawings and documents are stored in a computer, such as a designer's personal computer. When designers need to design a new building automation system for a specific building, they may be able to use the pre-rendered drawings and documents as their own database or library. Based on specifications of the building, designers search for the closest matching pre-rendered drawings and documents among the existing database. Upon finding of the drawings and documents, designers modify the closest-matching drawings to reflect differences and uniqueness of the specifications relative to the design contained in the closest-matching drawings.

For this reason, designers often maintain and organize a few hundreds or thousands pre-rendered drawings and documents. The pre-rendered drawings and documents occupy a significant part of storage space of a designers' computer. Further, it is time-consuming and difficult to find the closest-matching drawings and documents. Designers may not be able to memorize which drawings and documents represent the building automation system for which they search. Even if designers find the closest-matching drawings and documents, they make manual modifications. Even if designers newly create drawings and documents for the current specifications, they often desire or need to change or modify the configured system plans. For instance, when designers change one end device of the configured system, they are often required to find several drawings and documents and make manual modifications thereto. Manual modification is prone to errors and is not cost effective. Further, the manual modification tends to limit the number of permutations designers can provide to customers.

BRIEF SUMMARY

By way of introduction, the embodiments described below include methods, processes, apparatuses, and systems for generating an output for a building automation system configuration.

A configuration output system generates a plurality of types of outputs based on one set of data associated with user-selected features for a configured building automation system. The plurality of types of outputs may include graphical and/or textual representations of the configured system. The configuration output system may generate summaries, drawings, detailed explanations, and programmed specifications of the configured system. The configuration output system provides a tool bar that allows users to select each type of a displayed output.

Users provide the data associated with selected features of the configured system to the configuration output system. The configuration output system includes a plurality of data processing engines that are operable to generate the plurality of types of outputs. The configuration output system may include or interact with a configuration engine. The configuration engine provides a design interface to users and receives the data associated with selected features. The configuration engine stores the data in a suitable data storage medium. The data processing engines receives the stored data and formats it to be suitable for the plurality of types of outputs. This formatting is transparent to users and no installation or loading of computer applications such as an AutoCAD application is required, but may be provided. As a result, the data processing engines operate to generate the plurality of types of outputs.

In a first aspect, a configuration output system for use with a building automation system is provided. The output system includes a database and an output engine block. The database contains a configuration data set selected by a user. The output engine block is operable to generate a plurality of types of outputs representing the configured building automation system as a function of the configuration data set.

In a second aspect, a method for generating an output for a building automation system configuration is provided. The method includes receiving data associated with user-selected features for the configured system and processing the received data to form a set of output data. The method also includes generating a plurality of types of outputs displayed based on the one set of output data.

In a third aspect, a computer-readable medium having instructions executable on a computer stored thereon is provided. According to the instructions, data associated with user-selected features for a configured building automation system is received. The received data is filtered to form one or more data group. A plurality of types of outputs is generated based on the filtered data.

Other systems, methods, features and advantages will be, or will become, apparent to one with skill in the art upon examination of the following figures and detailed description. It is intended that all such additional systems, methods, features and advantages be included within this description, and be protected by the following claims.

BRIEF DESCRIPTION OF THE DRAWINGS

The components and the figures are not necessarily to scale, emphasis instead being placed upon illustrating the principles of the invention. Moreover, in the figures, like referenced numerals designate corresponding parts throughout the different views.

FIG. 11A illustrates an exemplary PPCL (Power Process Control Language) representation.

DETAILED DESCRIPTION OF THE DRAWINGS AND THE PRESENTLY PREFERRED EMBODIMENTS

A configuration output system for use with a building automation system is provided. The configuration output system generates a representation of a configured building system. The representation includes a plurality of types of outputs for the configured system. The representation may be graphical and/or textual. The graphical representation may include, for example, an electrical schematic, a mechanical schematic, and/or a graphic representation. The textual representation may include a summary, a list of devices, a brief explanation, etc. of the configured system. The configuration output system may include or interact with a configuration engine that processes input data associated with user-selected features. Users select features of the configured building automation system such as devices, components and parts. Selectable features are presented to users based on options for mechanical equipment, control strategies and end devices. A plurality of data processing engines may format and/or filter the data associated user-selected features to be suitable for a particular representation, which may be graphical, textual, or any other type of representation. As a result, the data processing engines operate to generate the plurality of types of outputs based on one set of the user-selected data.

Figure 1:
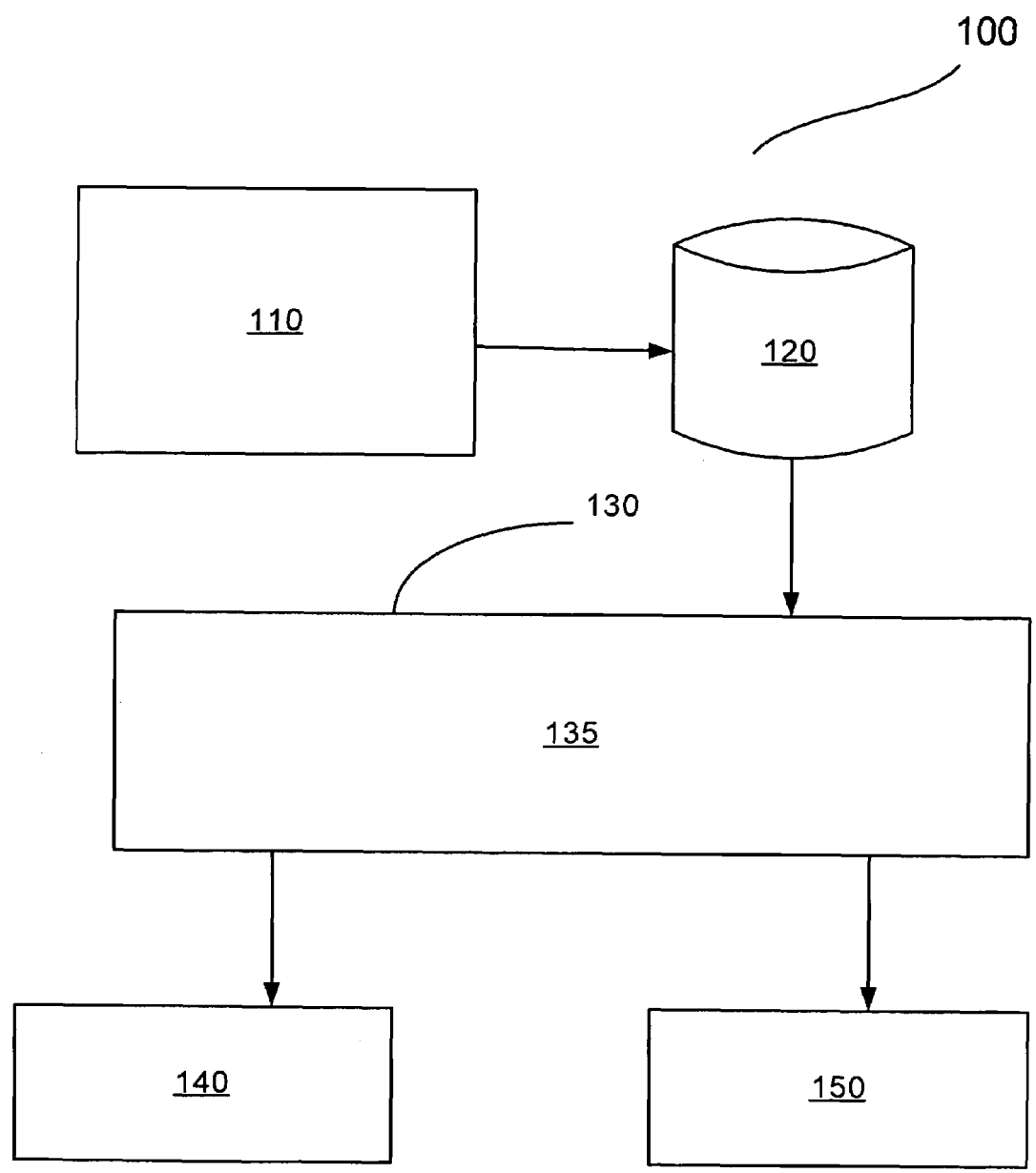
FIG. 1 is a block diagram of one embodiment of a configuration output system.

FIG. 1 is a block diagram of one embodiment of a configuration output system 100. The configuration output system 100 includes a configuration engine 110. Alternatively, or additionally, the output system 100 and the configuration engine 110 may be separately arranged and operable to interact with each other. In another embodiment, the output system 100 receives configuration data from any source, such as the configuration engine 110 or a transfer of data from manual entry, memory or a network connection. The output system 100 also includes a database 120 and an engine block 130.

The configuration engine 110 is operable to process data associated with features selected by users. Users may be any person who is familiar with the configuration of a building automation system, such as a designer, an engineer, etc. The data associated with selectable features may include, for example, information associated with components and the relationship of the components with selectable features of a building automation system. The features include type of actuation, controller type, temperature detectors, thermostats, piping configurations, valve types, fan types, pressure sensors, duct sensor, wiring options, and any other type of component that may be used in a building automation system. The data also may include information related to the scope of components including control wiring, type, power wiring, interlocks, dampers, smoke detectors, terminal unit controllers, terminal unit actuators, chiller flow switches, boiler flow switches, and the like.

The configuration engine 110 provides a design interface to users. The design interface presents the selectable features to users, who in turn select desired features and provide them to the configuration engine 110. As a result, users are able to configure a building automation system by providing responses to selections for features of the building automation system to be configured. The user configures or designs one or various independent areas of a building as part of a project for the building. The areas are configured and saved as a discrete part of an overall project. As the selections are made, components of the system are identified and a data set representing the selected features and/or components is populated. The populated data set is stored in database 120 or any other storage medium. The database 120 includes a single file or a collection of files composed of organized records having one or more fields of data. The data is retrieved and stored in the database 120.

The database 120 further includes data associated with business rules and various datasets. The business rules define allowable configuration for the configured system. The business rules take into consideration mechanical equipments, associated control strategies and options for end control devices to configure the building automation system. Based on the business rules, data sets are created and stored in the database 120. The data sets include default conditions that create a configured system in response to a set of selections by users. The created configured system is functional and reflects budgeting and estimating process. For instance, when users select an air duct system and related features, the data sets provide the output system 100 with default conditions such as a graphic symbol and textual descriptions for the selected air duct system, coordinates of the graphic symbol and the textual descriptions, etc. In other embodiment, the data sets for the default conditions may be stored in a separate database.

The configuration engine 110 and engine block 130 include a same or different data processor operatively coupled to the database 120. Any data processors, computers, databases, data storage, and controller systems such as personal computers, notebook computers, computer networks, workstations, mainframe computers, servers, and the like may be used. The configuration engine 110 and engine block 130 also may be embodied as computer software or firmware including object and/or source code, hardware, or a combination of software and hardware. Further detailed descriptions on a configuration engine, such as the configuration engine 110, may be found in the related U.S. Application filed on Feb. 4, 2005, entitled Building Control Configurator, and having attorney reference number 2004 P10921US 01, which is incorporated by reference in its entirety herein.

The engine block 130 includes a plurality of data processing engines 135. The engine block 130 are operable to process the populated data set stored in the database 120. Specifically, the data processor included in the engine block 130 processes, filters and formats the populated data set to be suitable for a particular representation. While a building automation system is being configured, the status of the system may be displayed to the user. The status identifies features, areas, components, or groups of components that have been selected and areas to be configured or outstanding features or tasks for completion. The status may be represented graphically or textually. Users have options or a tool bar to choose a desired representation. By way of example, users may choose an electrical schematic, a mechanical schematic, a summary, a graphics, an estimating IDs, etc. To generate various representations, the data processing engines 135 may include, but not limited to, AutoCAD engine, PPCL (Power Process Control Language) engine, Sequence of Operations engine, Estimating IDs engine, Price engine, Points engine, Graphic engine etc. Various engines and representations will be described in detail in conjunction with FIGS. 4 and 6-13.

The representations provided by the engine block 130 mainly provide two types of information. The first type of information 140 is estimation of the configured system. For example, the Price engine and the Estimating IDs engine as noted above operate to provide the estimation information such as an estimated total cost, a unit price, etc. The second type of information 150 is design information regarding the configured system. The AutoCAD engine, PPCL engine, Sequence of Operations engine and Points engine operate as a mechanical design tool for users. Specifically, these engines visualize the configured system with mechanical drawing and/or graphical drawing and provide explanation about the design. Users are able to evaluate the expenses and the design of the configured system with ease at the same time.

Figure 2:
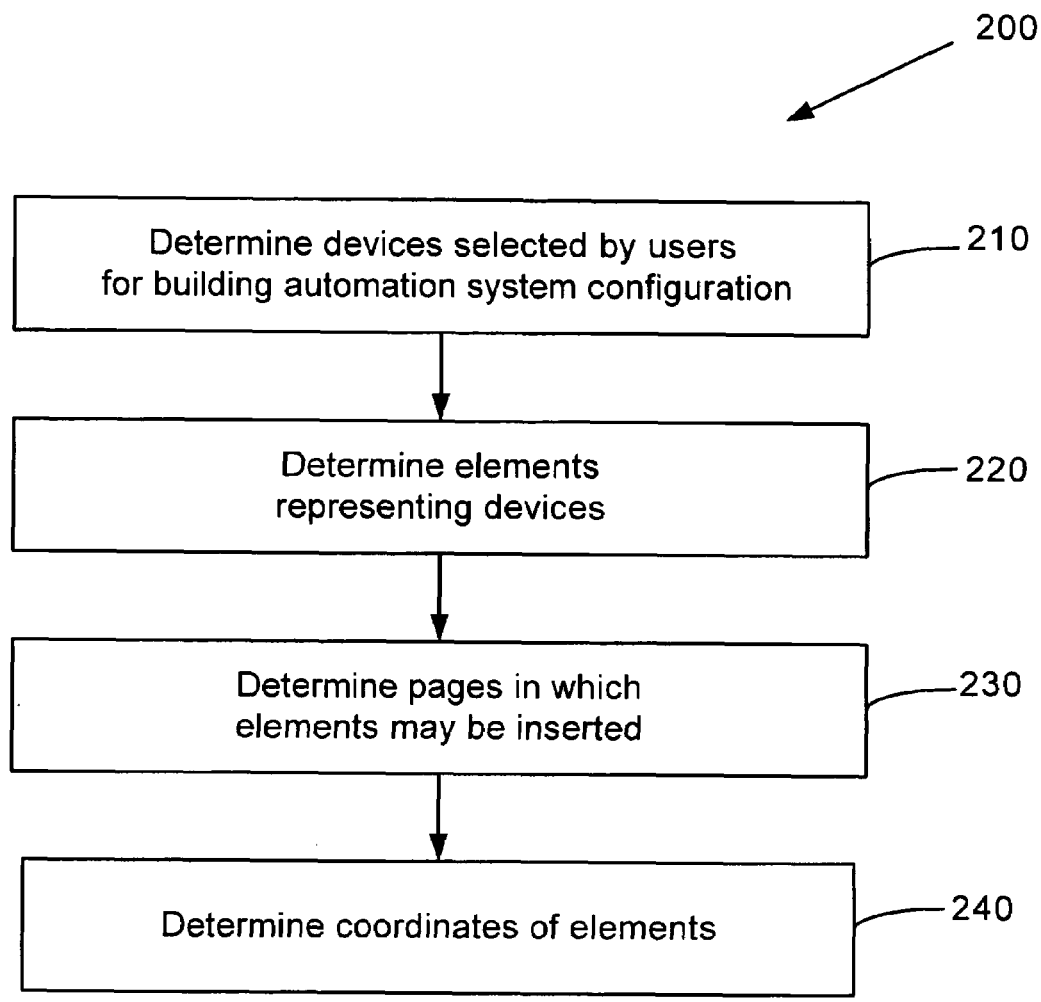
FIG. 2 is a flowchart illustrating exemplary data processing operations.

FIG. 2 is a flowchart illustrating exemplary data processing operations of data processing engines, such as the data processing engines 135 of FIG. 1. The flowchart of FIG. 2 is by way of example only and various other operations may be possible with different, additional or fewer acts in the same or different order. In particular, FIG. 2 illustrates a graphical representation performed by engines such as the Graphic engine, the AutoCAD engine, etc. Further descriptions on the graphical representation and related engines are provided in connection with FIGS. 4, 7-8 and 13 below. The flowchart of FIG. 2 may be directed to data processing for the graphic representation. Data processing for textual representation is described in detail in conjunction with FIGS. 9A-12B. At act 210, data processing engines such as the data processing engines 135 and/or a data processor identify devices selected by users. Devices may include, for instance, an air handling unit ("AHU"), an air valve, a fan system, a ventilation system, an air conditioning system, an air purifier system, and a fire alarm system. To represent the selected devices, elements are determined and assigned to each device at act 220. The elements may be graphical. The graphical elements include graphical symbols and/or icons. Each graphical element represents a device, a component, a part or any other selected features. For instance, a narrow channel shaped symbol or icon may represent air ducts. Different colors, line thicknesses, shapes, connectors or graphics may be used to distinguish the same devices with different features. Part number, device number, or any type of engineering properties associated with schematic drawings also may be used. A library of graphical elements are provided for each possible device, component, selected features and combinations thereof. The library may be stored as one of the data sets for default conditions as noted above.

At the next act 230, the data processing engines and/or the data processor further determine in which page to insert the determined elements. Graphical representation by the output system 100 may involve one or more pages. The act 230 may be omitted for a one-page representation. The representation of the configured system often uses multiple pages. For instance, the representation of a configured wiring easily occupies multiple pages. At act 240, a coordinates of each graphical element is determined. Coordinates may be a pair of real numbers in scaled units that identify a point in the drawing plane. For example, the elements are positioned in locations relative to the actual layout or building plan. The coordinates of the element may be stored as one of the data sets for default conditions. For instance, the data set include a coordinates data that associates a graphical icon for the selected air duct system with a particular coordinates. This coordinates data serves as a default coordinates. The coordinates data may be by way of setting a default coordinates condition and it is changeable in response to a particular configuration of the system. For In accordance with acts 210-240, the data processing engines determine devices to be displayed, elements to represent the devices, and/or pages and coordinates on the pages of the elements. Data processing operations such as the acts 210-240 are transparent to users. Users' selection is limited to basic or high level devices and their related features for use with the configured system. Users are unaware of or do not participate in further operation such as the data processing operations once they have made the selections.

The data set for default conditions stored in the database 120 provide information associated with elements, coordinates and pages for the filtering. The data processing engines, the data processors, or the configuration engine may retrieve necessary information from the data set for default conditions during the filtering.

Figure 3:
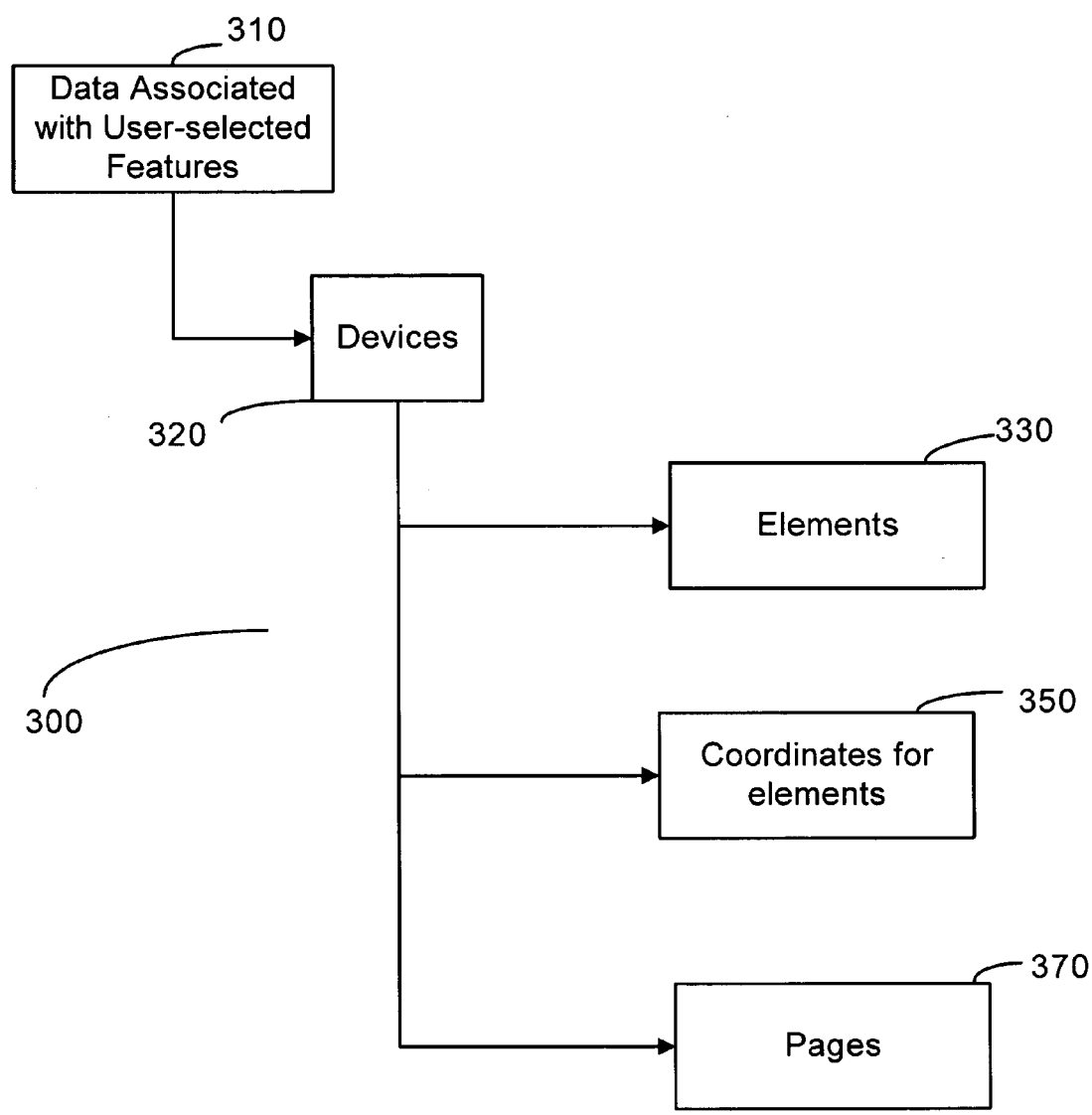
FIG. 3 is a chart illustrating one example data structure resulting from the data processing operations.

Based on the acts 210-240 of FIG. 2, the data for user-selected features is processed and organized as at least one data group. The data processing engines filter the data to result in a predetermined data structure with one or more data groups. FIG. 3 illustrates one example data structure as a result of the data processing operations of FIG. 2. In particular, FIG. 3 is directed to the data structure for the graphical representation. The data structure of FIG. 3 is only by way of example and various data structures are possible. Data structures for textual representations are further described in detail in conjunctions with FIGS. 9-12 illustrating various textual representations. The processed data is arranged or grouped as a data group 320 for selected devices, a data group 330 for elements, a data group 350 for coordinates of elements, and a data group 370 for pages, respectively. The data group 320 represents devices, components, parts, etc. of the configured system selected by users. For instance, the data group 320 may include an AHU system, a damper, an actuator and a heating coil. During the filtering, the data processing engines operate to identify devices from data associated with user-selected features 310 (see act 210).

The data group 330 includes elements representing devices contained in the data group 320. The elements may include collection of symbols, and/or icons graphically representing the selected devices. During the filtering, the data processing engines operate to associate the devices in the data group 320 with the elements in the data group 330. The data processing engines operate to retrieve or compute coordinates of the elements. The coordinates of the elements indicate displayed location or position of the elements. The data group 350 stores the coordinates of the elements. The data group 370 indicates a particular page among multiple pages in which a certain element is inserted. The data processing engines operate to associate the elements with coordinates information in the data group 350 and pages information in the data group 370. As a result, a particular element is displayed at a location set by the coordinate information on a determined page.

The data groups 320-370 correspond to organization and arrangement of the data 310, which facilitate efficient and prompt processing of the data 310. Further, retrieval and search of information contained in the data groups 320-370 become more organized and effective. The data structure with the data groups 320-370 is suitable for the configured building automation system, which frequently involves a large amount of data relating to user-selected features and representation thereof.

The data structure as shown in FIG. 3 assigns a different level of hierarchy to each data group. Referring to FIG. 3, the data group 320 is assigned with a highest level of hierarchy. This level of hierarchy may relate to priority processing by the data processing engines. Specifically, the data processing engines first processes the data 310 to identify devices information described in connection with FIG. 2. The data groups 330-370 are assigned with the same level of hierarchy. Alternatively, or additionally, the data groups 330-370 may have different levels of hierarchy. For instance, based on the processing sequence of FIG. 2, the data group 330 is assigned with a high level, the data group 370 with an intermediate level and the data group 350 with a low level. The data structure of FIG. 3 is by way of example only and various data structure is possible.

Figure 4:
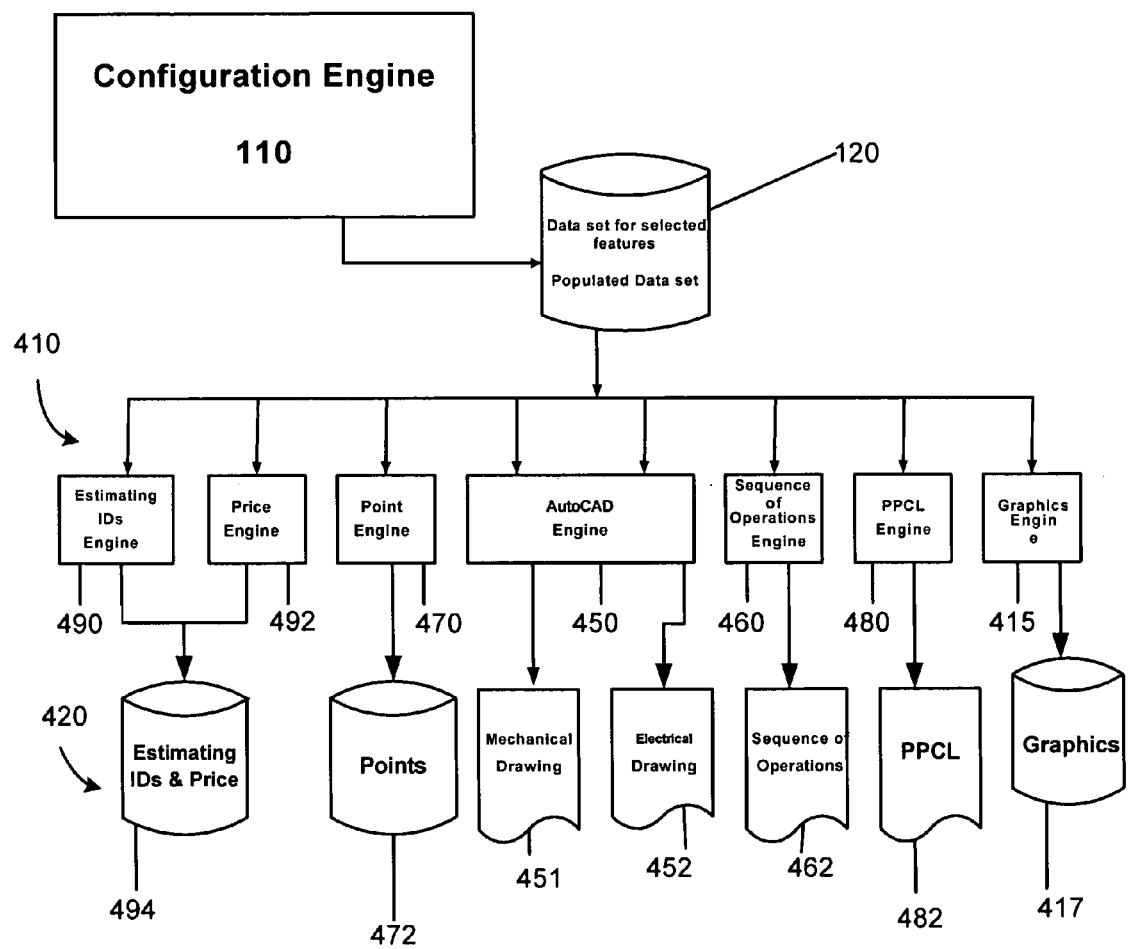
FIG. 4 is a block diagram illustrating a plurality of data processing engines.

FIG. 4 illustrates-a plurality of data processing engines 410 for use in the engine block 130 of FIG. 1. The data set for the selected features and identified components is processed and filtered by one or more of the plurality of data processing engines 410 shown in FIG. 4. As a result of processing by these engines 410, reports, drawings, summaries, descriptions, figures and like output 420 are generated. When a system has been configured, the engines 410 are invoked to generate representations for the configured system. In one embodiment, the configuration engine 110 may communicate with the engines 410 and invoke them. Because the engines 410 interact with the configuration engine 110, users do not need to load each engine or implementing applications to generate the desired representations. For example, users are able to obtain AutoCAD drawings without installing and loading a separate AutoCAD application. Instead, the engines 410 provide a tool bar for selection of the representations by users. The tool bar having one or more tabs, icons or buttons. Each tab, icon or button corresponds to the representation by one of the engines 410.

The data processing engines 410 may be embodied as computer software or firmware including object and/or source code, hardware, or a combination of software and hardware. The data processing engines 410 may be stored on a computer-readable medium installed on, deployed by, resident on, invoked by and/or used by one or more data processors, computers, clients, servers, gateways, or a network of computers, or any combination thereof. For example, a configuration engine such as the engine 110 may invoke the data processing engines 410. Alternatively, or additionally, the data processing engines 410 may include a data processor operatively coupled to a data storage medium. The data storage medium may store computer applications that generate the different types of outputs and/or the outputs. The data processing engines 410 interact with the data processor to filter the data associated with user-selected features as illustrated in FIGS. 2 and 3. The data processing engines 410 and the data processor further operate to format the filtered data to be suitable for the various outputs and representations.

As shown in FIG. 4, the data processing engines 410 include Estimating ID's engine 490, Price engine 492, Point engine 470, AutoCAD engine 450, Sequence of Operations engine 460, PPCL engine 480, and Graphics engine 415. As a result of the operations of the data processing engines 410, mechanical and electrical drawings 451, 452, PPCL representation 482, Graphics representation 417, Sequence of Operations 462, Points representation 472, and/or Estimating IDs & Price representation 494 are provided. Further descriptions on these engines will be provided in conjunction with FIGS. 6-13 illustrating a particular output generated by each engine. Alternatively, or additionally, fewer or more engines and various other engines are possible.

Figure 5:
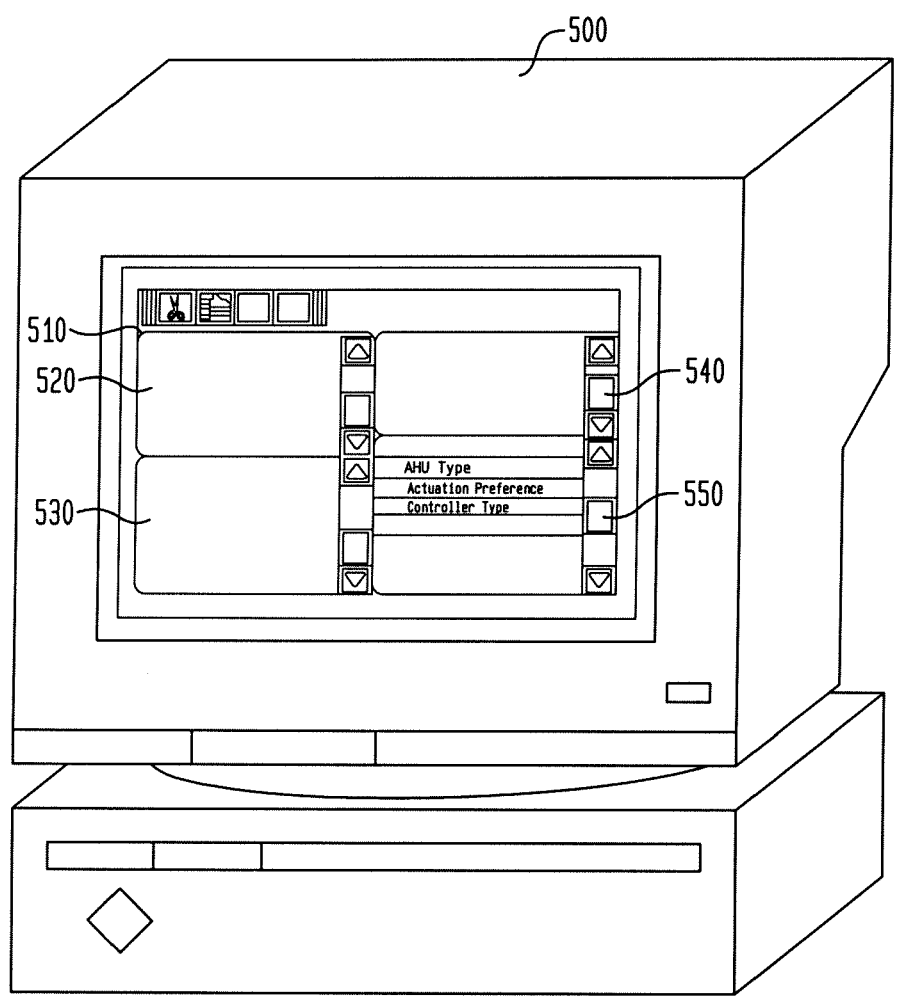
FIG. 5 illustrates an exemplary implementation of the configuration output system.

FIG. 5 shows an exemplary implementation of a configuration output system such as the configuration output system 100. A data processing system 500 may be a workstation, a personal computer, or any type of data processing device. The system 500 includes a monitor 510 and a processor (not shown). Using a data input device, a user interfaces the system 500 to input selections or cause the transfer of selections made by others or previously provided, and to generate a plurality of types of outputs representing a configured system or a data related to a configured system. As noted above, the plurality of types of outputs include drawings, summaries, reports, etc. The system 500 may integrate representations with other interfaces on a single screen or may display them separately. The outputs may be represented in windows, such as windows 520, 530 or 540.

FIGS. 6-13 illustrate various representations provided by data processing engines such as the data processing engines 410 of FIG. 4. The representations of FIGS. 6-13 are generated based on one set of data associated with user-selected features. Each representation is generated based on the same data set and represents a different aspect of the configured system. For the representations illustrated in FIGS. 6-13, users have selected devices including an AHU, a fan system, a duct system and a heating coil system. Once the selection has been made, a configuration engine such as the configuration engine 110 of FIG. 1 receives and processes the selected data and stores it in a database such as the database 120. When the building automation system has been configured, the data processing engines operate to generate the plurality of types of outputs representing the configured system. The data processing engines provide users with options to evaluate the configured system with different types of representations and outputs. Other sets of data for the same or different plans, devices or configurations may be provided.

Figure 6:
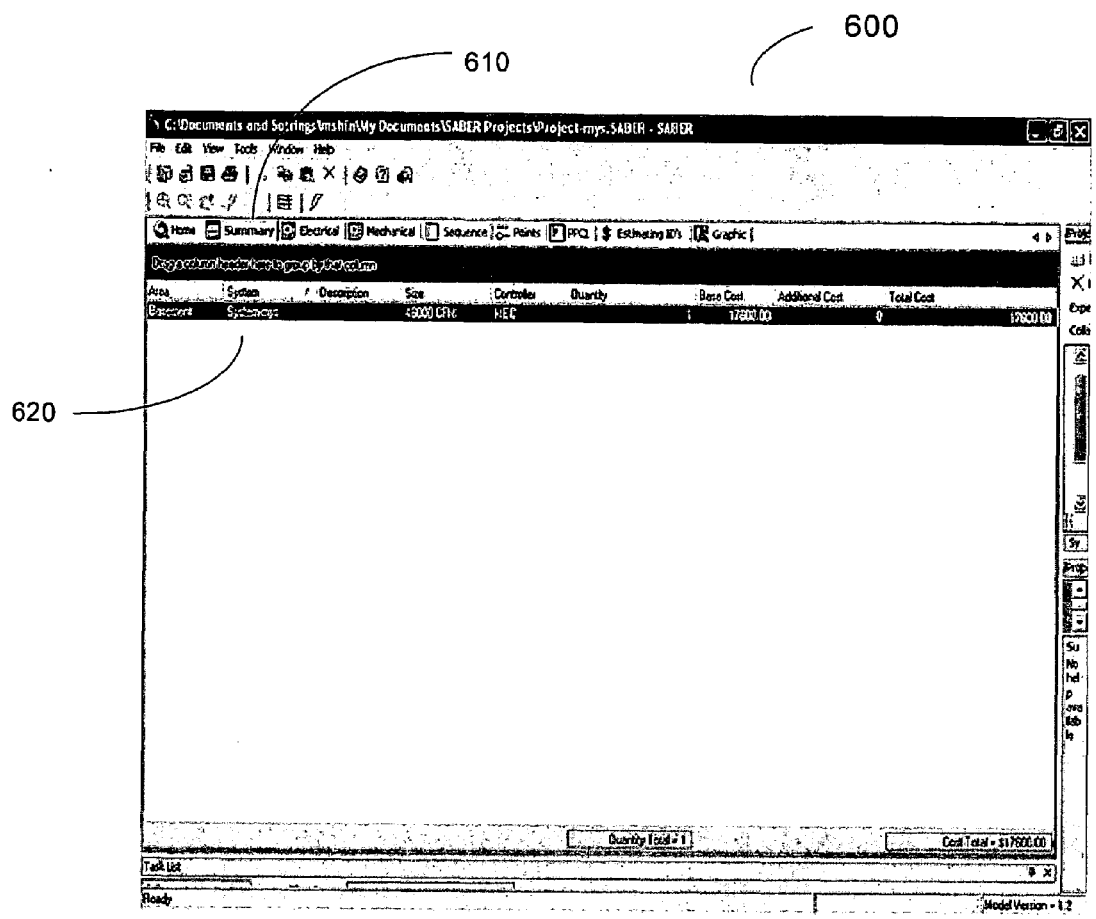
FIG. 6 illustrates an exemplary summary representation.

FIG. 6 illustrates an exemplary Summary representation 600. The data processing engines include summary engine to process the data and generate the Summary representation. FIG. 4 does not show the summary engine, but such engine may be added. A tool bar 610 is presented to users on a screen of a monitor such as the monitor 510 of FIG. 5. The tool bar 610 shows tabs or buttons corresponding to available representations. By simply clicking "Summary" tab 610 on the tool bar, users are able to view the summary displayed. The Summary representation 620 provides general information or executive summary about the configured system. Specifically, the Summary representation 620 provides summary about a configured area, a name of system, size of the configured area, a controller type, base cost, etc. The summary representation 620 may include data from one or more of the other engines or additional information.

Figure 7:
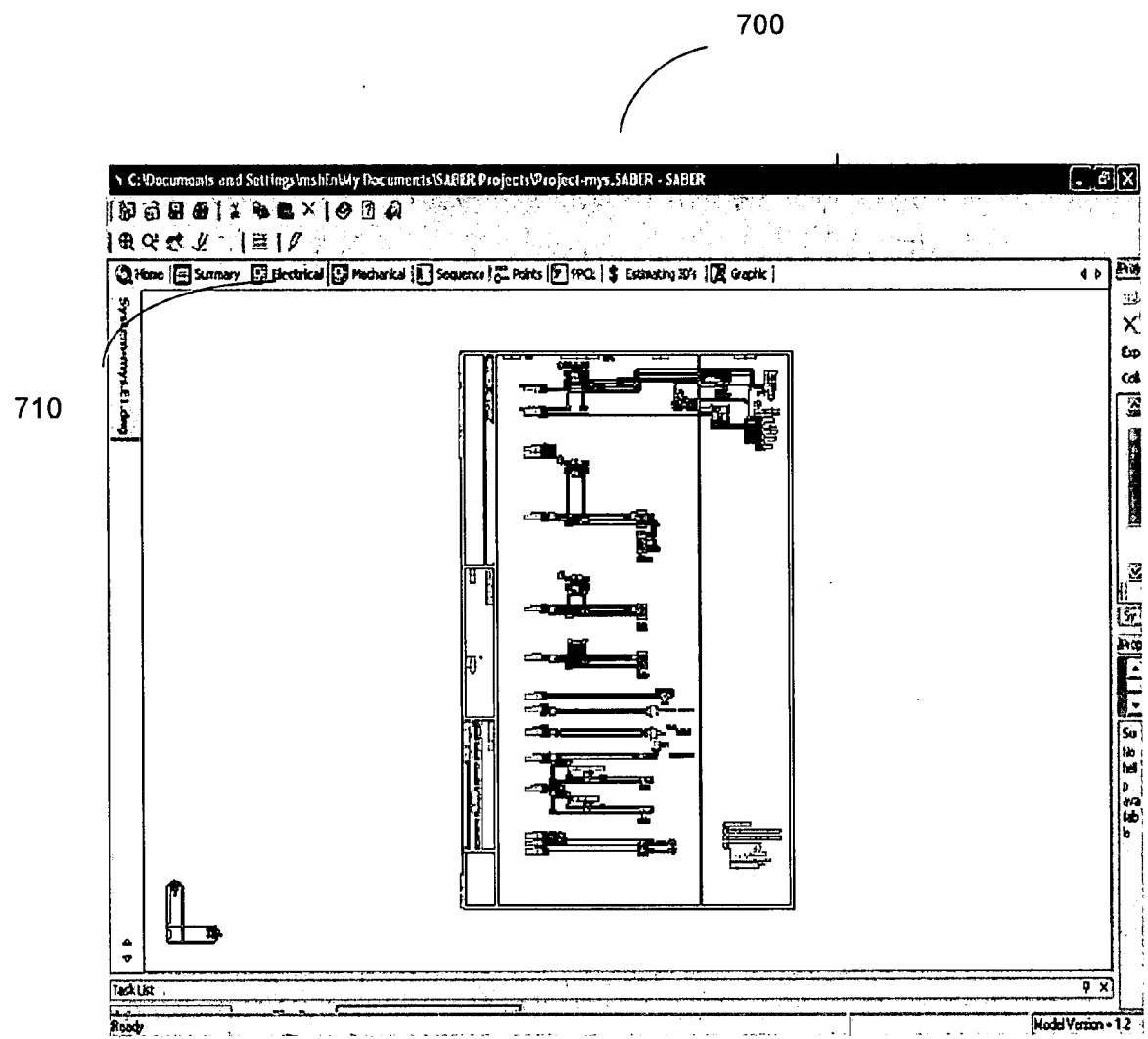
FIG. 7 illustrates an exemplary electrical representation.
Figure 8:
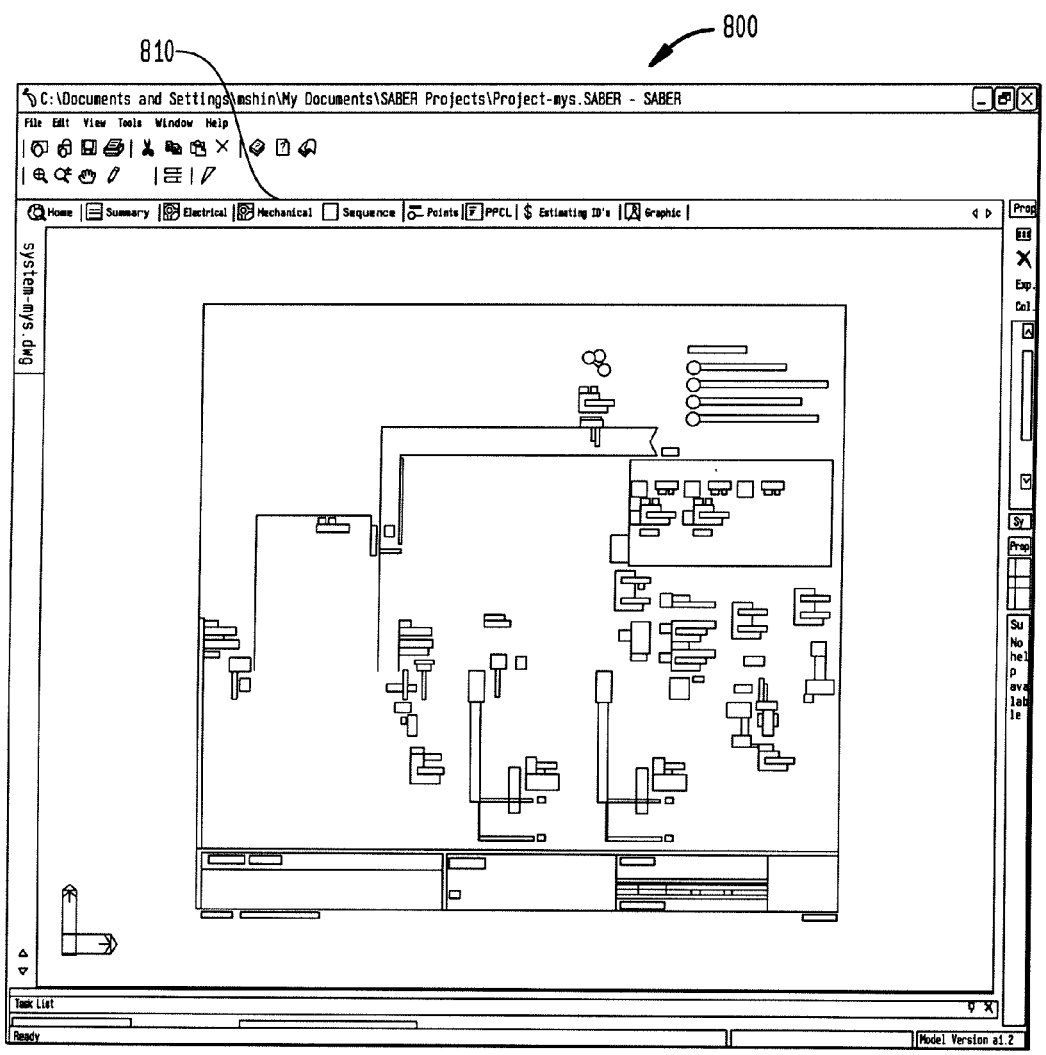
FIG. 8 illustrates an exemplary mechanical representation.

FIGS. 7 and 8 illustrate exemplary Electrical and Mechanical schematic representations 700 and 800. Referring to FIG. 4, AutoCAD engine 450 is provided that generates mechanical drawing 451 and electrical drawing 452. The AutoCAD engine 450 may include a well-known computer-aided drafting application for personal computers. Alternatively, or additionally, the AutoCAD engine 450 may be a processor coupled to a database with AutoCAD applications stored therein. The AutoCAD engine 450 is designed to be operable with a configuration engine such as the configuration engine 110. Users do not need to install or load CAD related applications separately. Instead, users simply select Electrical and Mechanical tabs 710 and 810. The Electrical schematic representation 700 illustrates the electrical components of the configured system. The Mechanical schematic representation 800 illustrates a mechanical layout or relative layout of the components. In FIGS. 7 and 8, the Electrical and Mechanical representations 700, 800 illustrate electrical and mechanical arrangements of the selected AHU, duct, fan and heating coil systems. A data processor interacting with the AutoCAD engine and/or a configuration engine such as the configuration engine 110 of FIG. 1 retrieves data from the data sets for default conditions. The data processor filters data associated with the selected AHU, duct, fan and heating coil systems as illustrated in FIGS. 2 and 3. In response to the data and the data sets for default condition, a default configuration system is created. For the Electrical and Mechanical representations 700, 800, part numbers and device numbers are shown with the elements representing the selected devices and related components. The use of the numbers and/or other engineering tips helps users understand the representation of the configured system.

Figure 9A:
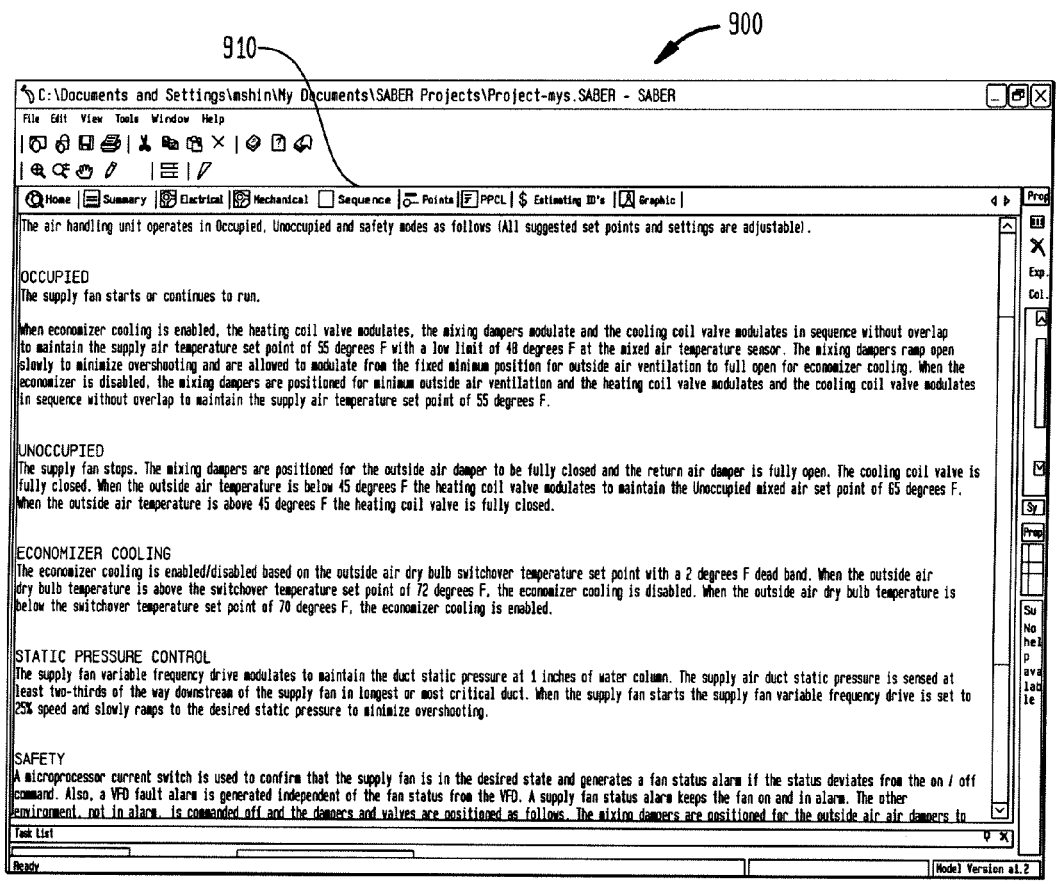
FIG. 9A illustrates an exemplary sequence representation.

FIG. 9A illustrates an exemplary representation for Sequence of Operations ("Sequence") 900. A Sequence of Operations engine such as the engine 460 of FIG. 4 generates the Sequence representation 900. Users run no separate application and simply select Sequence tab 910. The Sequence representation provides a detailed written description for the configured system as shown in FIG. 9A. For the representation, the sequence may be formatted to include commas, conjunctions and periods. The following explanation is displayed to users selecting the configured system in the example embodiment with the air duct system and the fan system.

Static Pressure Control

The supply fan variable frequency drive modulates to maintain the duct static pressure at 1 inches of water column. The supply air duct static pressure is sensed at least two-thirds of the way downstream of the supply fan in longest or most critical duct. When the supply fan starts the supply fan variable frequency drive is set to 25% speed and slowly ramps to the desired static pressure to minimize overshooting.

The text is provided as an element associated with a particular device or combination of devices. The Sequence engine may format a text such as the above text with a rich text document format, but other formats are available. Values or characteristics described in the text may be determined based on selected options or other attributes of the device or configured building automation system.

Figure 9B:
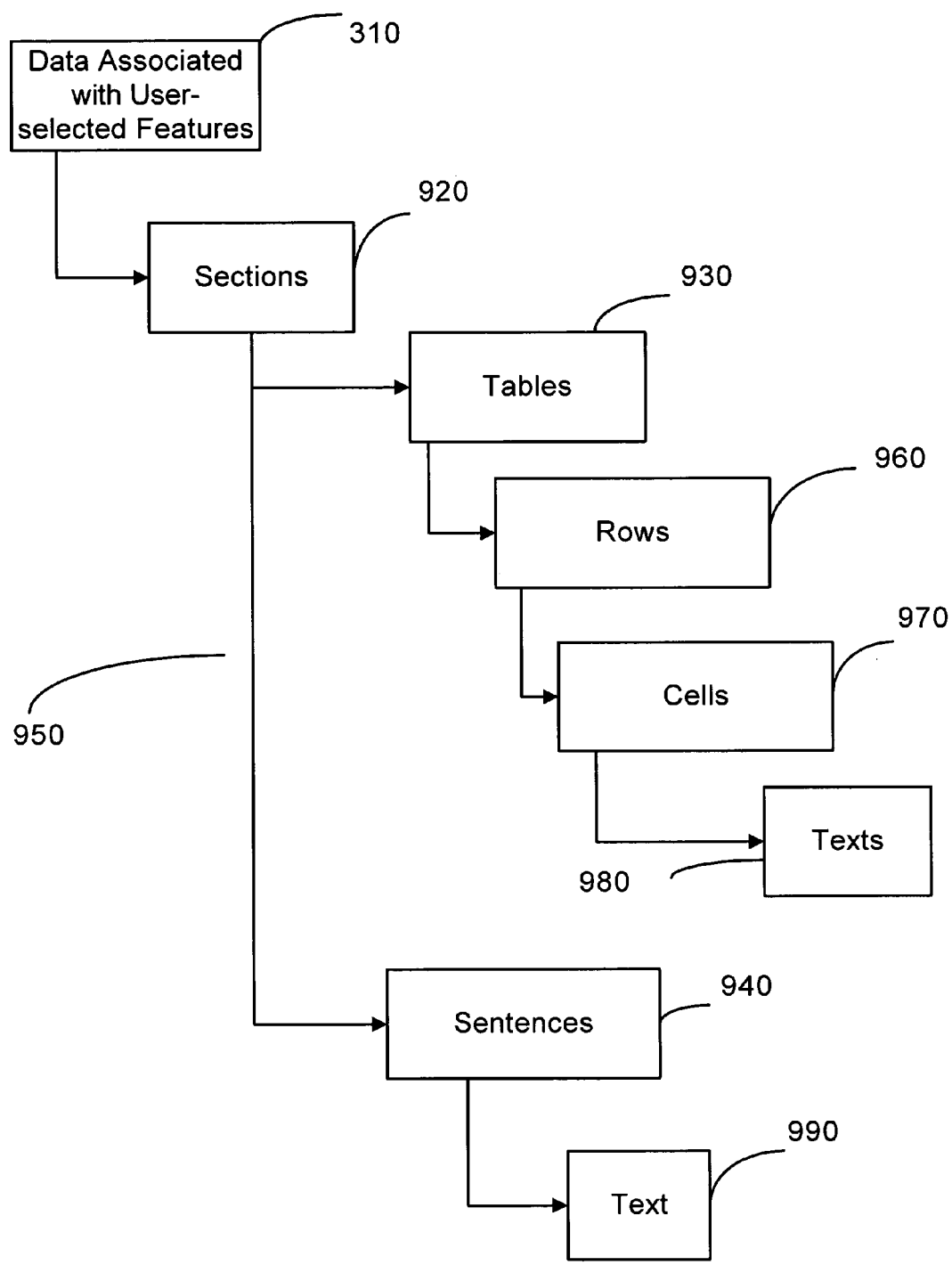
FIG. 9B illustrates an exemplary data structure for the sequence representation.

FIG. 9B illustrates an exemplary data structure 950 for the Sequence representation. At least one section is identified from the data set for the Sequence representation. This data set is based on the data associated with user-selected features such as the data 310 of FIG. 3. The section may, for example, correspond to a paragraph explaining selected features. The section is grouped and arranged in a section data group 920. From the section data group 920, at least one table that appears on the Sequence representation is determined and grouped in a table data group 930. Further, at least one sentence is determined from the section data group and grouped as a sentence data group 940. At least one subdata group is derived from the table data group 930. For example, a row data group 960 includes information associated with rows appearing in the table. A cell data group 970 is derived from the row data group and includes column information of specific row of the table. From the cell data group 970, a text data group 980 is derived. The text data group 980 includes information associated with words or groups of words contained in each cell determined in the cell data group 970. Another text data group 990 is derived from the sentence data group 940. This text data group 990 includes text information appearing in each sentence.

A different level of hierarchy may be assigned to each data group described above. From the data set for the Sequence representation, the section data group 920 occupies the highest level. The table data group 930 and the sentence data group 940 are assigned with a next high level of hierarchy. The table data group 930, the row data group 960 and the cell data group 970 are sequentially assigned with a decreasing level of priority. The text data groups 980 and 990 deriving from the table data group 930 and the sentence data group 940 is assigned with the lowest level of hierarchy. The assignment of hierarchy here is by way of example and other assignments are possible.

The data processing and filter operations by the Sequence engine may be performed in accordance with the data structure described above. The Sequence engine first processes the data from the section data group 920. The Sequence engine determines whether there is any table appearing in the representation. Upon the determination of the table, the Sequence engine further determines rows of the table, cells, i.e., columns of each row and text information appearing in each cell. Upon determination that no table is needed, the Sequence engine determines whether any sentence is needed to generate the Sequence representation.

The PPCL tab 1110 on the tool bar generates the representation that displays codes for a controller of the system. The code may be generated according to the convention for programming the controllers of the configured system. For the representation, the generated code may be added with sequential line numbers, comma separating argument and parameters. The maximum of 75 characters may be used per a comment line. The generated PPCL code is complied and uploaded to actual controllers. The exemplary PPCL representation includes physical inputs, physical outputs, counter, user-defined control points as follows:

```
PHYSICAL OUTPUTS
00202 C
00204 C \NAME FOR THE SUPPLY FAN IS                              (PL2SL)\SAF\
00206 C \NAME FOR THE SUPPLY FAN VARIABLE FREQUENCY DRIVE IS     (PLAO)\SVD\
00208 C \NAME FOR THE MIXING DAMPERS IS                          (PLAO)\MAD\
00210 C \NAME FOR THE COOLING COIL VALVE IS                      (PLAO)\CCV\
00212 C \NAME FOR THE HEATING COIL VALVE IS                      (PLAO)\HCV\
00214 C
00216 C PHYSICAL INPUTS
00218 C
00220 C \NAME FOR THE SUPPLY FAN VFD ALARM IS                    (PLDI)\SVA\
00222 C \NAME FOR THE MIXED AIR TEMPERATURE IS                   (PLAI)\MAT\
00224 C \NAME FOR THE SUPPLY AIR STATIC PRESSURE IS              (PLAI)\SSP\
00226 C \NAME FOR THE SUPPLY AIR TEMPERATURE IS                  (PLAI)\SAT\
00228 C \NAME FOR THE LOW TEMPERATURE DETECTOR IS                (PLDI)\LTD\
00230 C \NAME FOR THE RETURN SMOKE DETECTOR IS                   (PLDI)\RSD\
00232 C \NAME FOR THE SUPPLY SMOKE DETECTOR IS                   (PLDI)\SSD\
00234 C \NAME FOR THE STATIC PRESSURE CUT OUT IS                 (PLDI)\HSP\
00236 C
00238 C VIRTUAL ANALOG OUTPUTS
00240 C
00242 C \NAME FOR THE TEMPERATURE CONTROLLER IS                  (VLAO)\TCL\
```

The Sequence engine processes contents of the sentences if any. Subsequently, the Sequence engine identifies and determines words within each sentence.

Figure 10:
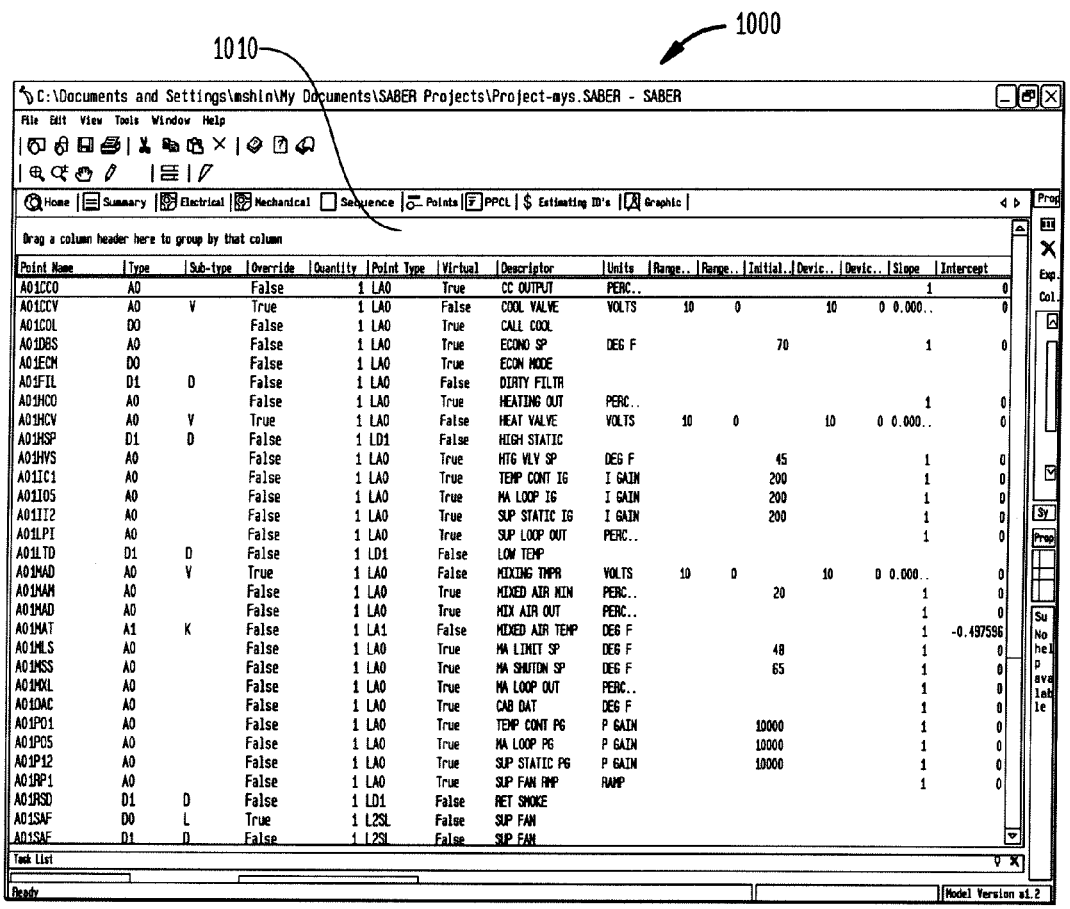
FIG. 10 illustrates an exemplary points representation.

FIG. 10 shows an exemplary Points representation by a Point engine such as the Point Engine 470 of FIG. 4. Upon selection of the Points tab 1010, the Points representation is operable to display control points for the system. Specifically, the Points representation displays various fields including Point Name, Type, Quantity, Description and Units. This Point representation is generated with an APOGEE™ system provided by Siemens Building Technologies, Inc. of Buffalo Grove, Ill. The APOGEE™ system allows the setting and/or changing of various controls of a building control system. Users do not install this proprietary system because this system may be built-in with the Point engine and operable to communicate with the configuration engine 110. The control points are determined based on specific devices, such as controllers, identified in the configuration data. The associated text or fields are generated as elements. The Points engine 470 output the representation, but may additionally allow for user selection or alteration of setpoints or other values automatically set with defaults by the Points engine 470. The Points representation may be formatted with XML (Extensible Markup Language) and other formats are available.

Figure 11A:
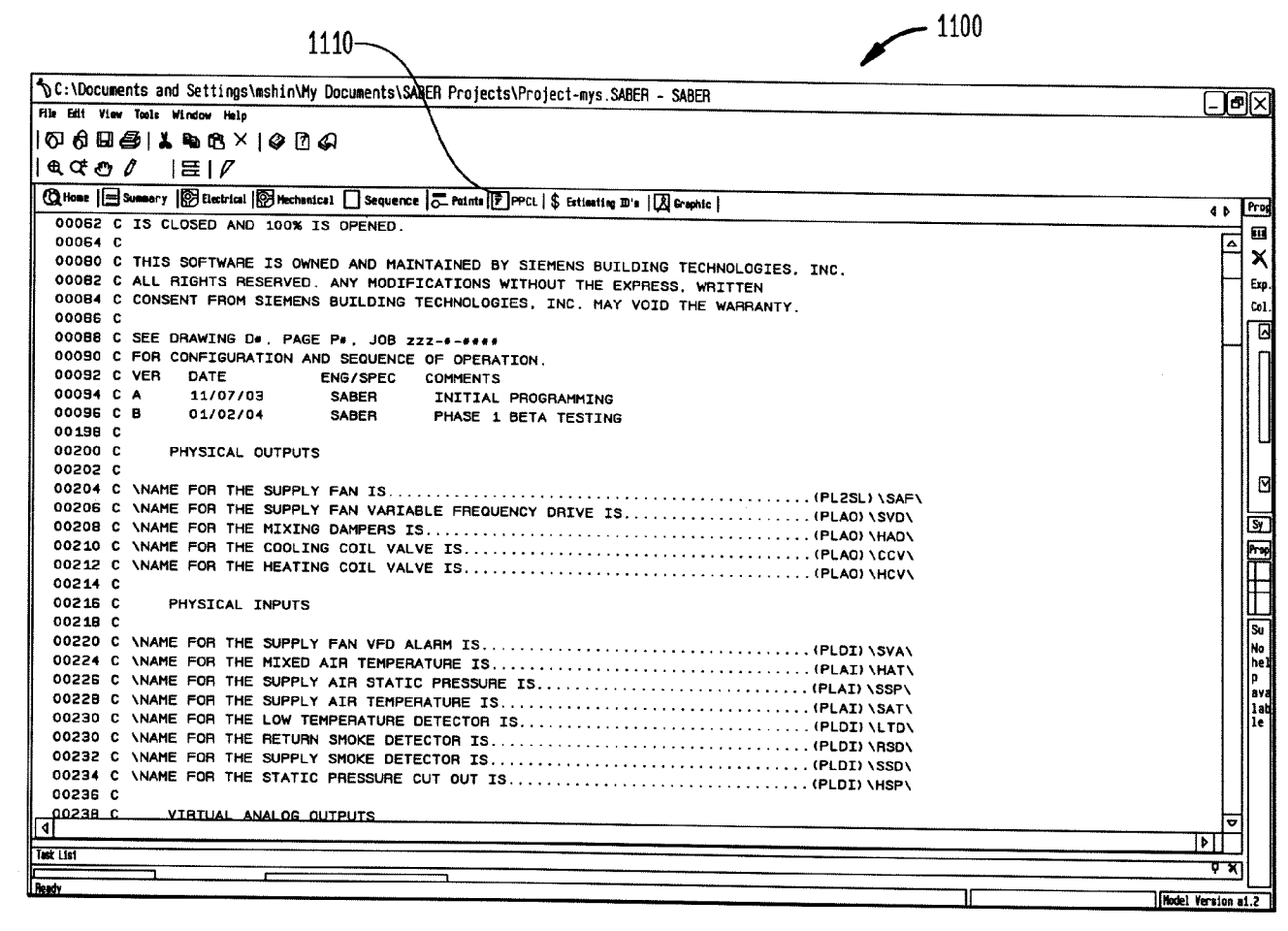

FIG. 11A illustrates an exemplary PPCL representation by a PPCL engine such as the PPCL Engine 480 of FIG. 4. The PPCL application stands for Power Process Control Language and is an application provided by Siemens Building Technologies, Inc. Other applications for generating control instructions for a building automation system may be used. Based on identifying the devices, the instructions, physical inputs, physical outputs, counter and/or set points are provided as elements.

Figure 11B:
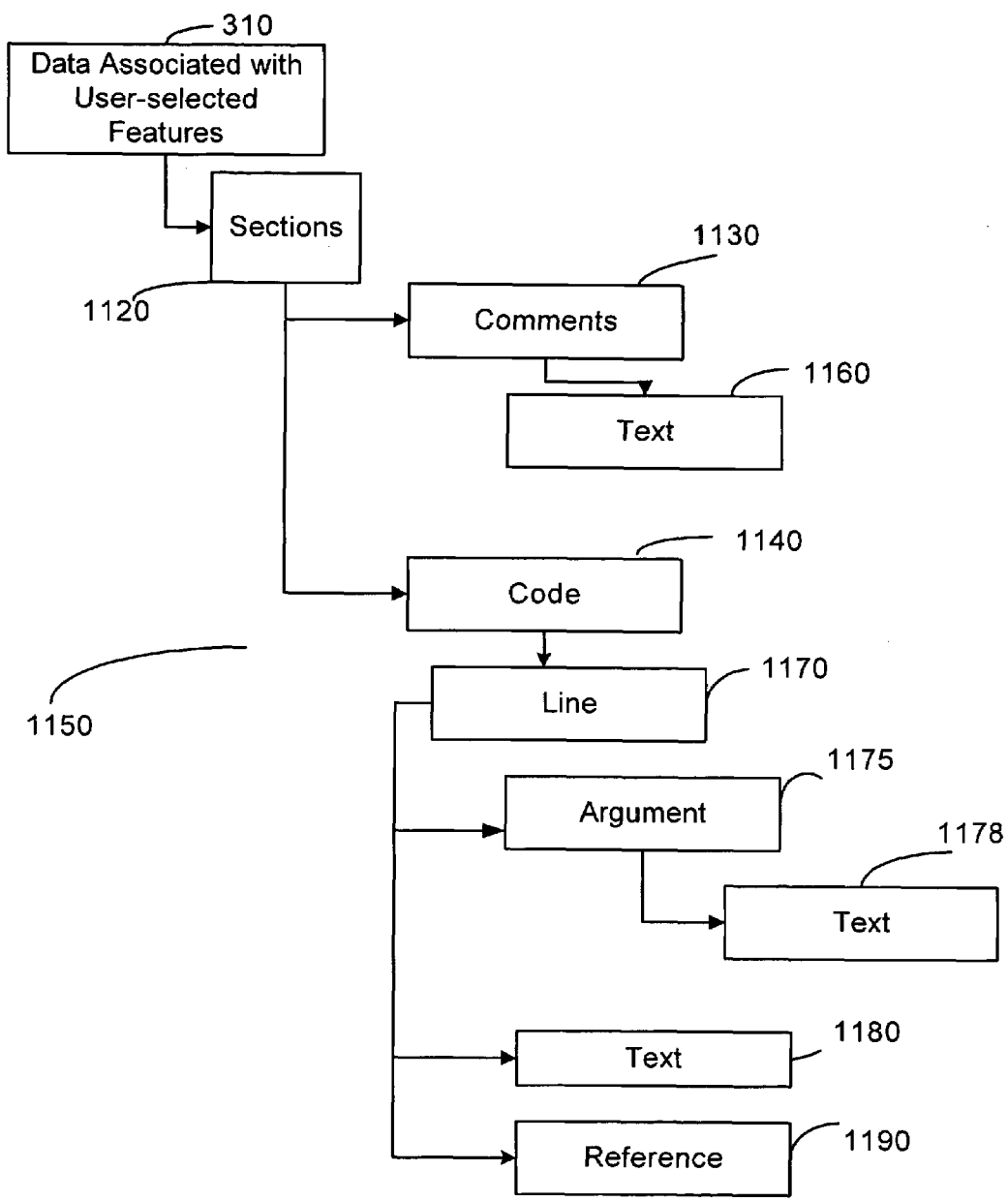
FIG. 11B illustrates an exemplary data structure for the PPCL representation.

FIG. 11B illustrates an exemplary data structure 1150 for the PPCL representation. The data structure for the PPCL representation is organized and processed as follows. From the data set for the PPCL representation, a section data group 1120 is identified and determined with the highest level of hierarchy. The data set for the PPCL representation is based on the data associated with user-selected features such as the data 310 of FIG. 3. The section data group 1120 includes data associated with at least one section. The section includes comments and code lines that make up PPCL programs. The section data group 1120 arranges and groups different sections. From the section data group, a comment data group 1130 is derived. The comment data group 1130 includes non-executable lines of code, which provides descriptions of functionality executed by code lines. From the comment data group 1130, a text data group 1160 is derived. The text data group 1160 includes information associated with individual words or groups of words. The comment data group 1130 is assigned with a higher level of hierarchy than the text data group.

From the section data group 1120, a code data group 1140 is also derived. The code data group 1140 includes executable code lines. A line data group 1170 is derived from the code data group 1140 and includes an executable code line. From the line data group 1170, at least three sub-data groups are derived. The sub-data groups may include, but not limited to, an argument data group 1175, a text data group 1180 and a reference data group 1190. The argument data group 1175 includes an argument that is passed to a function.

A text data group 1178 may be derived from the argument data group 1175. Another text data group 1180 includes individual words or groups of words that make up a syntactically valid code line. The reference data group 1190 includes a place holder for a line number. When line numbers are assigned later with processing, this place is filled with the determined line numbers. The same level of hierarchy may be assigned to the argument data group, the text data group and the reference data group. Alternatively, different level of hierarchy may be assigned to these three sub-data groups. A higher level of hierarchy is assigned to the line data group 1170 than the sub-data groups 1175, 1180 and 1190.

The data processing operations by the PPCL engine is performed in accordance with the data structure described above. The PPCL engine first identifies and determines sections of code. Upon determination that the sections of code includes at least one code block, the PPCL engine sequentially determines and filters code lines, arguments, references and programming codes. If the PPCL engine does not identify the code block, it identifies and determines at least one comments block. The PPCL engine further identifies text information from the comments block.

Figure 12A:
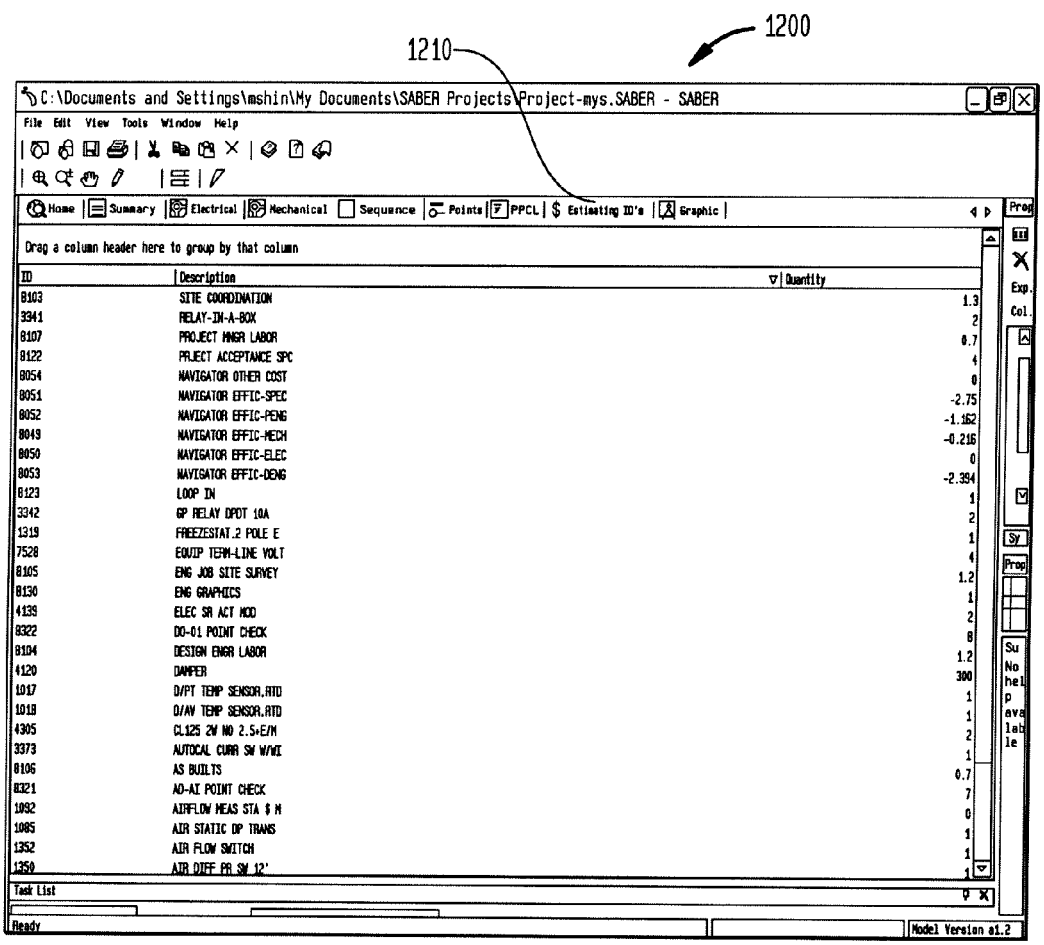
FIG. 12A illustrates an exemplary Estimating IDs representation.

FIG. 12A illustrates an exemplary Estimating ID's representation 1200 processed by engines such as the Estimating ID's engine 490 and the Price engine 492 of FIG. 4. The Estimating ID tab 1210 provides a list of the components and the relative cost for the components as textual elements. Specifically, components are listed with further elements, such as their IDs, brief descriptions and quantity. Price information is not shown in FIG. 12A, but may be provided. The price is either initially provided based on the configuration, or users change or modify displaying options to check a unit price. The Estimating IDs representation may be formatted with XML and other formats are available.

As the data processing operation illustrated in FIG. 2, the data processing operation by the Estimating ID engine is performed as follows. Based on the data set associated with selected features by users, at least one budget instance is identified and determined. This data set is based on the data associated with user-selected features such as the data 310 of FIG. 3. The budget instance may involve the configuration with a specific system, a particular design, a particular component, etc. The Estimating ID engine filters data associated with budget details from data associated with the budget instance. The budget details identify devices, components, parts, etc. selected by users and/or employed by the configured system, the number of each selected features and pricing information. From the budget details data, estimating IDs and quantity data are filtered and determined.

Figure 12B:
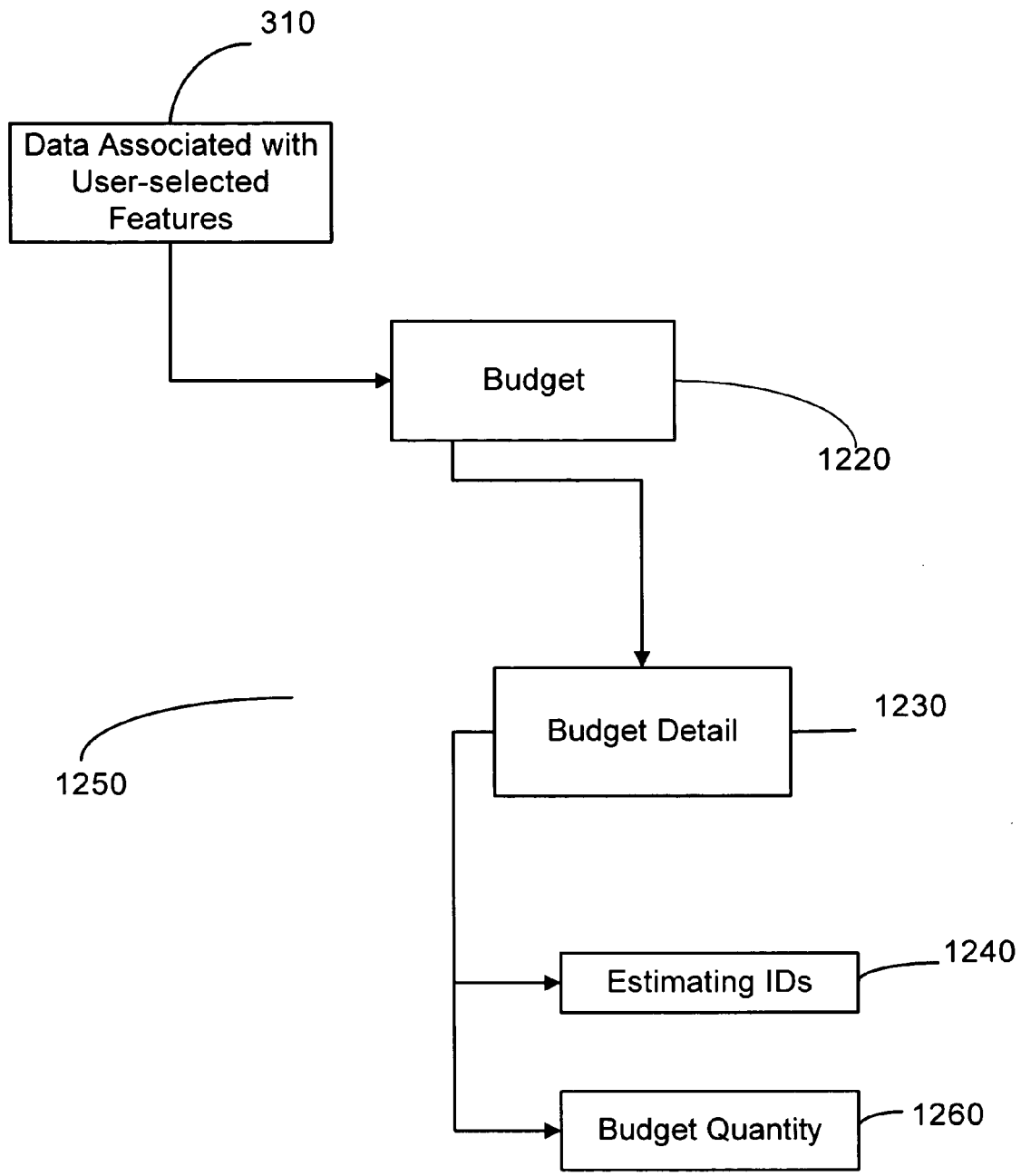
FIG. 12B illustrates an exemplary data structure for the Estimating IDs representation.

FIG. 12B illustrates an exemplary data structure 1250 for the Estimating ID's representation. As a result of data filtering and processing by the Estimating ID engine, the data set for the Estimating ID's representation is organized to have a set of predetermined data groups. From the data set associated with budget information selected by users, at least one budget data group 1220 is identified. The budget data group 1220 is a grouping of different budget detail instances. For instance, each budget group may include data associated with a particular system, such as an AHU system. For the budget data group, estimating IDs and quantities are determined in a budget detail data group 1230. For the AHU system, IDs and quantities of selected devices, components and parts may be determined. From the budget detail data group 1230, an Estimating ID data group 1240 and a budget quantity data group 1260 are filtered to be separated. The Estimating ID data group 1240 includes a list of mutually exclusive Estimating IDs. The budget quantity data group 1260 includes quantities of the list of mutually quantity Estimating IDs. The Estimating IDs and the budget quantity are respectively represented on a screen for evaluation and review by users.

A different level of hierarchy is assigned to each data group. By way of example, the budget data group 1220 is assigned with the highest level, the budget detail data group 1230 with an intermediate level and the Estimating ID data group 1240 and the budget quantity data group 1260 with a low level. Various other assignments of a different level of hierarchy are possible.

Figure 13:
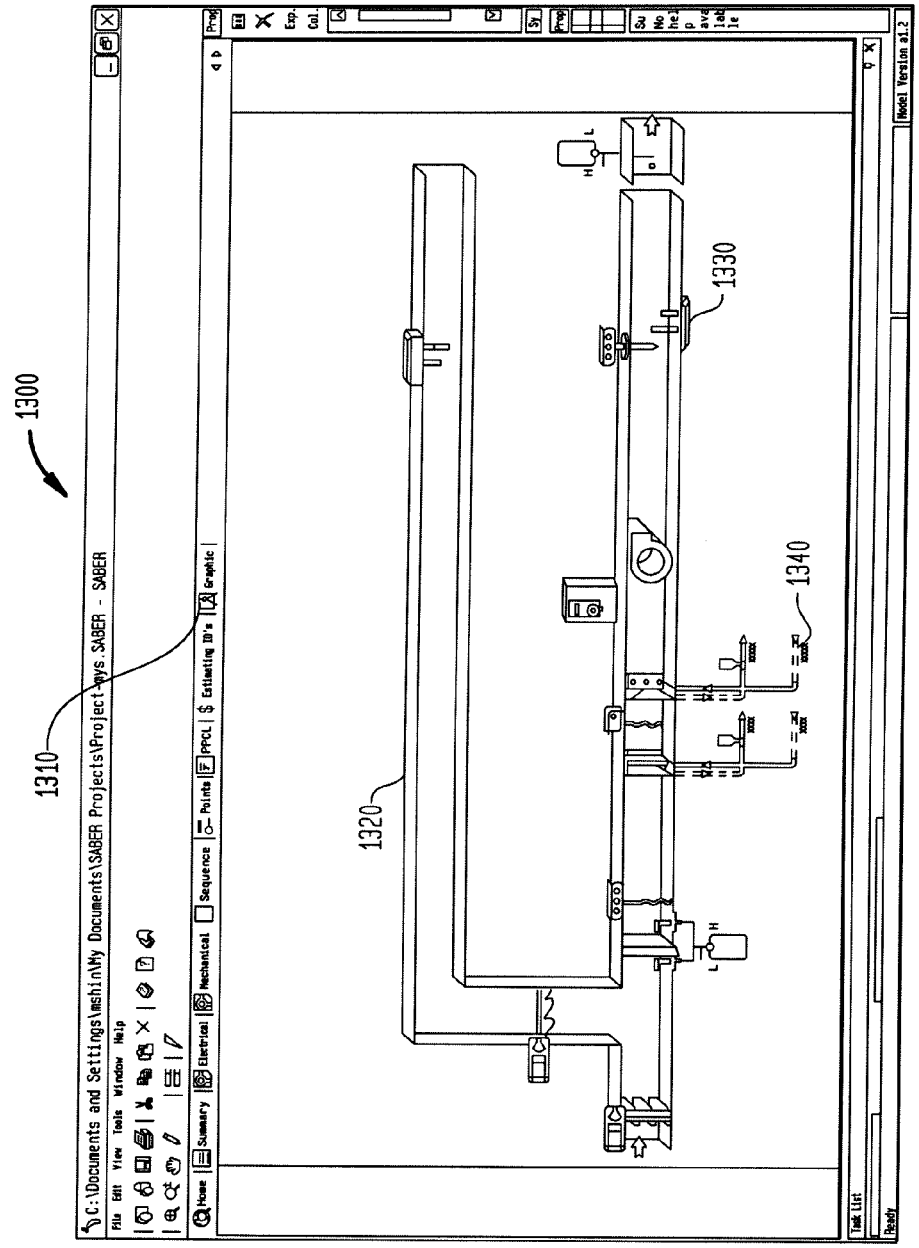
FIG. 13 illustrates an exemplary graphical representation.

FIG. 13 illustrates an exemplary Graphics representation 1300 processed by a graphics engine such as the Graphics engine 415 of FIG. 4. The Graphics representation shows symbols or icons of the configured system. The symbols or icons are selected as elements based on the devices in the configuration. Specifically, FIG. 13 illustrates the air duct system 1320, the actuators 1330 and the dampers 1340. Users are able to distinguish these devices and review their arrangements. The Graphics representation 1300 is a top view of the configured system. Alternatively, a side view, a rear view, a bottom view, etc. may be possible. The Graphics representation may be formatted with Micrografix™ drawing and other formats are possible.

Referring to FIGS. 6-13, various and different representations of the configured system are described. The described representations are by way of example and other representations are possible. Likewise, more or various data processing engines may be added to generate a particular representation. The data processing engines may include publicly available applications such as AutoCAD, Visio and Micrographics. Alternatively, or additionally, the engines also may include proprietary applications provided by Siemens Building Technologies, Inc. or others.

The configuration output system may allow users to avoid or minimize maintenance of thousands of pre-engineered library elements including documents, drawings, plans, datasheets, etc. Users no longer speculate about the configured system based on the pre-engineered drawings and plans. Because the configured system is graphically and textual presented and displayed to users upon operation of tabs or buttons of a tool bar, users visually review and evaluate the configured system. The amount of editing is minimized and the number of permutations for the configured system increases. If users are not satisfied with or need to change selections, they change the configuration option and outputs are automatically regenerated based on the changed option. Once users have selected the features, the output data set is automatically generated and imported into various engines, such as estimating, engineering and commissioning engines. The needs for the rework and reengineering of producing various outputs may be substantially minimized. Accordingly, accurate, effective and efficient configuration of the building automation system may be achieved with the configuration output system.

The configuration output system is described mainly in connection with the configuration of a building automation system, but the configuration output system is not limited thereto. The embodiments may be applicable to other systems or methods that involve various representations of data selected by users for design and/or configuration purposes.

It is therefore intended that the foregoing detailed description be regarded as illustrative rather than limiting, and that it be understood that it is the following claims, including all equivalents, that are intended to define the spirit and scope of this invention.

The invention claimed is:

1. A computer-readable medium having instructions executable on a computer stored thereon, the instructions comprising:

receiving data associated with user-selected features for a configured building automation system;

filtering the received data to form at least one data group;

assigning a different level of hierarchy to the data group;

generating a plurality of types of outputs based on the filtered data;

filtering the data to form a device data group, at least one device being identified from the data associated with user-selected features;

filtering the data to form an element data group, an element representing the device;

assigning a higher level of hierarchy to the device data group;

assigning the same level of hierarchy to the element data group and the page data group; and filtering the data to form a page data group, a page being associated with the element.

2. A computer-readable medium having instructions executable on a computer stored thereon, the instructions comprising:

receiving data associated with user-selected features for a configured building automation system;

filtering the received data to form at least one data group;

assigning a different level of hierarchy to the data group;

generating a plurality of types of outputs based on the filtered data;

filtering the data to form a device data group, at least one device being identified from the data associated with user-selected features;

filtering the data to form an element data group, an element representing the device;

assigning a high level of hierarchy to the device data group;

assigning an intermediate level of hierarchy to the element data group;

assigning a low level of hierarchy to the page data group; and filtering the data to form a page data group, a page being associated with the element.

3. The computer readable medium of claim 2, wherein the filtering instruction further comprises:

filtering the data to form a coordinates data group, a coordinates indicating a location of the element to be displayed.

4. The computer readable medium of claim 3, wherein the assigning instruction comprises:

assigning a lower level of hierarchy to the coordinates data group than the age data group.

* * * * *